US012618158B2

(12) United States Patent
Takahashi et al.

(10) Patent No.: US 12,618,158 B2
(45) Date of Patent: May 5, 2026

(54) SEMICONDUCTOR DEVICE MANUFACTURING METHOD

(71) Applicant: FUJI ELECTRIC CO., LTD.,
Kanagawa (JP)

(72) Inventors: Yuya Takahashi, Matsumoto (JP);
Shunsuke Tanaka, Matsumoto (JP)

(73) Assignee: FUJI ELECTRIC CO., LTD.,
Kanagawa (JP)

( * ) Notice: Subject to any disclaimer, the term of this
patent is extended or adjusted under 35
U.S.C. 154(b) by 346 days.

(21) Appl. No.: 18/356,233

(22) Filed: Jul. 21, 2023

(65) Prior Publication Data

US 2024/0102171 A1     Mar. 28, 2024

(30) Foreign Application Priority Data

Sep. 27, 2022    (JP) ................................ 2022-153807

(51) Int. Cl.
    *C23C 18/54*        (2006.01)
    *H01L 21/288*       (2006.01)
(52) U.S. Cl.
    CPC ............ *C23C 18/54* (2013.01); *H01L 21/288*
                                                (2013.01)
(58) Field of Classification Search
    CPC ............... H01L 21/288; C23C 18/1651; C23C 18/1653; C23C 18/1831; C23C 18/54;
C25D 3/38; C25D 5/10; C25D 5/12;
C25D 5/44; B32B 9/041; B32B 15/00;
B32B 15/01; B32B 15/20
See application file for complete search history.

(56) References Cited

U.S. PATENT DOCUMENTS

2021/0130968 A1*  5/2021  Yamauchi ................ C25D 5/12
2022/0235468 A1*  7/2022  Furuya .................... B32B 15/04

FOREIGN PATENT DOCUMENTS

JP      2001237262 A    8/2001
JP      2008248371 A    10/2008
JP      2020120133 A    8/2020
WO      2019163484 A1   8/2019
WO      2021020064 A1   2/2021

* cited by examiner

*Primary Examiner* — Brook Kebede

(57) ABSTRACT

Provided is a manufacturing method of a semiconductor device, comprising: performing a zincate treatment on a first metal layer provided above a semiconductor substrate with a zincate solution; forming a nickel-plated layer above the first metal layer; and forming a gold-plated layer above the nickel-plated layer, wherein in the performing the zincate treatment, a flow rate of the zincate solution supplied to a bath for performing the zincate treatment is 16 L/min or more and 20 L/min or less.

20 Claims, 11 Drawing Sheets

SEMICONDUCTOR DEVICE MANUFACTURING METHOD

The contents of the following patent application(s) are incorporated herein by reference: NO. 2022-153807 filed in JP on Sep. 27, 2022

BACKGROUND

1. Technical Field

The present invention relates to a manufacturing method of a semiconductor device.

2. Related Art

In Patent Document 1, it is described: "the surface of the metal plating is treated with a sealing agent prepared by dissolving at least one kind out of a neopentyl fatty acid ester, a dibasic acid, and an amine salt of dibasic acid, in at least one kind of solvent, such as alcohol-based, chlorine-based, and fluorine-based ones".

PRIOR ART DOCUMENT

Patent Document

Patent Document 1: Japanese Patent Application Publication No. 2001-237262.
Patent Document 2: WO 2021/020064.
Patent Document 3: Japanese Patent Application Publication No. 2008-248371.
Patent Document 4: WO 2019/163484.
Patent Document 5: Japanese Patent Application Publication No. 2020-120133.

BRIEF DESCRIPTION OF THE DRAWINGS

FIG. 6 illustrates an example of a cross-sectional view of the gold plating process and a dicing process of the comparative example.

DESCRIPTION OF EXEMPLARY EMBODIMENTS

Hereinafter, embodiments of the present invention will be described, but the following embodiments are not for limiting the invention according to the claims. In addition, not all of the combinations of features described in the embodiments are essential to the solution of the invention.

In the present specification, one side in a direction parallel to a depth direction of a semiconductor substrate is referred to as "upper", and the other side is referred to as "lower". One of two main surfaces of a substrate, a layer, or other members is referred to as an "upper surface", and the other surface is referred to as a "lower surface". The "upper", "lower", "front", and "back" directions are not limited to the gravitational direction or the direction of attachment to a substrate or the like at the time of mounting of a semiconductor device.

Figure 1:
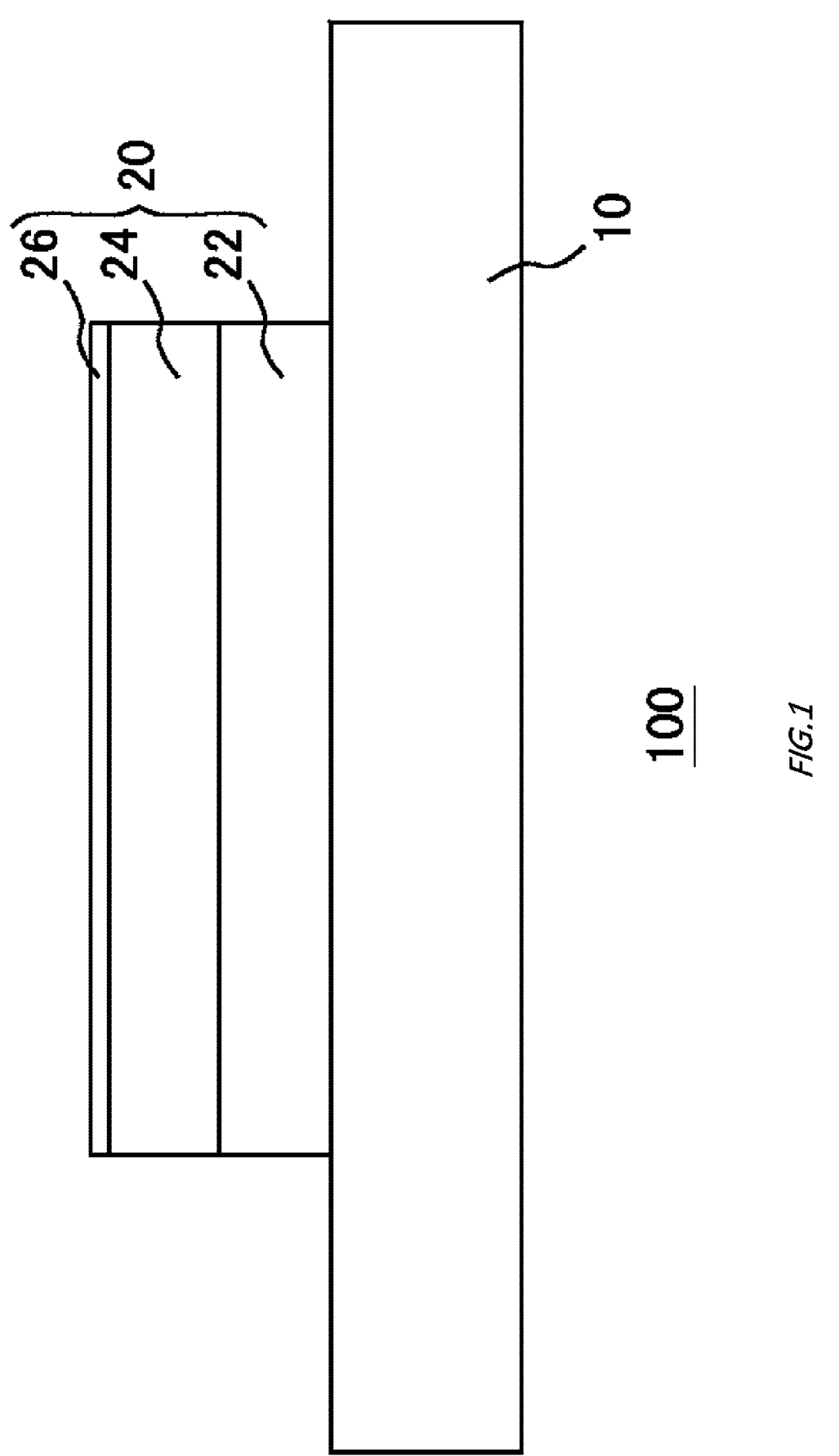
FIG. 1 illustrates an example of a cross-sectional view of a semiconductor device 100.

FIG. 1 illustrates an example of a cross-sectional view of a semiconductor device 100. The semiconductor device 100 comprises a semiconductor substrate 10 and an electrode portion 20. The electrode portion 20 includes a first metal layer 22, a nickel-plated layer 24, and a gold-plated layer 26.

The semiconductor device 100 may be in wafer form or may be in chip form. By way of example, the semiconductor device 100 may be a reverse conducting IGBT (RC-IGBT).

The semiconductor substrate 10 may be a silicon substrate, may be a silicon carbide substrate, or may be a nitride semiconductor substrate, such as a gallium nitride semiconductor substrate, or the like.

The electrode portion 20 is provided above the semiconductor substrate 10. The electrode portion 20 may be used to electrically connect the semiconductor device 100 with the outside of the semiconductor device 100. The electrode portion 20 may be electrically connected with the outside of the semiconductor device 100 by a bonding wire. The electrode portion 20 may be electrically connected with a conductive member, such as a lead frame, by using solder. By way of example, the electrode portion 20 may be an emitter electrode provided to an RC-IGBT. By way of another example, the electrode portion 20 may be a collector electrode provided to an RC-IGBT.

The first metal layer 22 is provided above the semiconductor substrate 10. The first metal layer 22 may include at least either aluminum or an aluminum-silicon alloy. In the present example, the first metal layer 22 includes an aluminum-silicon alloy.

The nickel-plated layer 24 is provided above the first metal layer 22. The nickel-plated layer 24 may contain phosphorous. The phosphorous content in the nickel-plated layer 24 may be 5 mass % or more and 10 mass % or less. Containing phosphorous facilitates the nickel-plated layer 24 to become sturdy and less likely to crack.

The gold-plated layer 26 is provided above the nickel-plated layer 24. The film thickness of the gold-plated layer 26 may be 0.01 μm or more and 0.1 μm or less. The film thickness of the gold-plated layer 26 being 0.1 μm or less enables improving the bond between gold and a conductive member, such as a lead frame, and ensuring the reliability of the connection between the gold and the conductive member, such as a lead frame.

Figure 2:
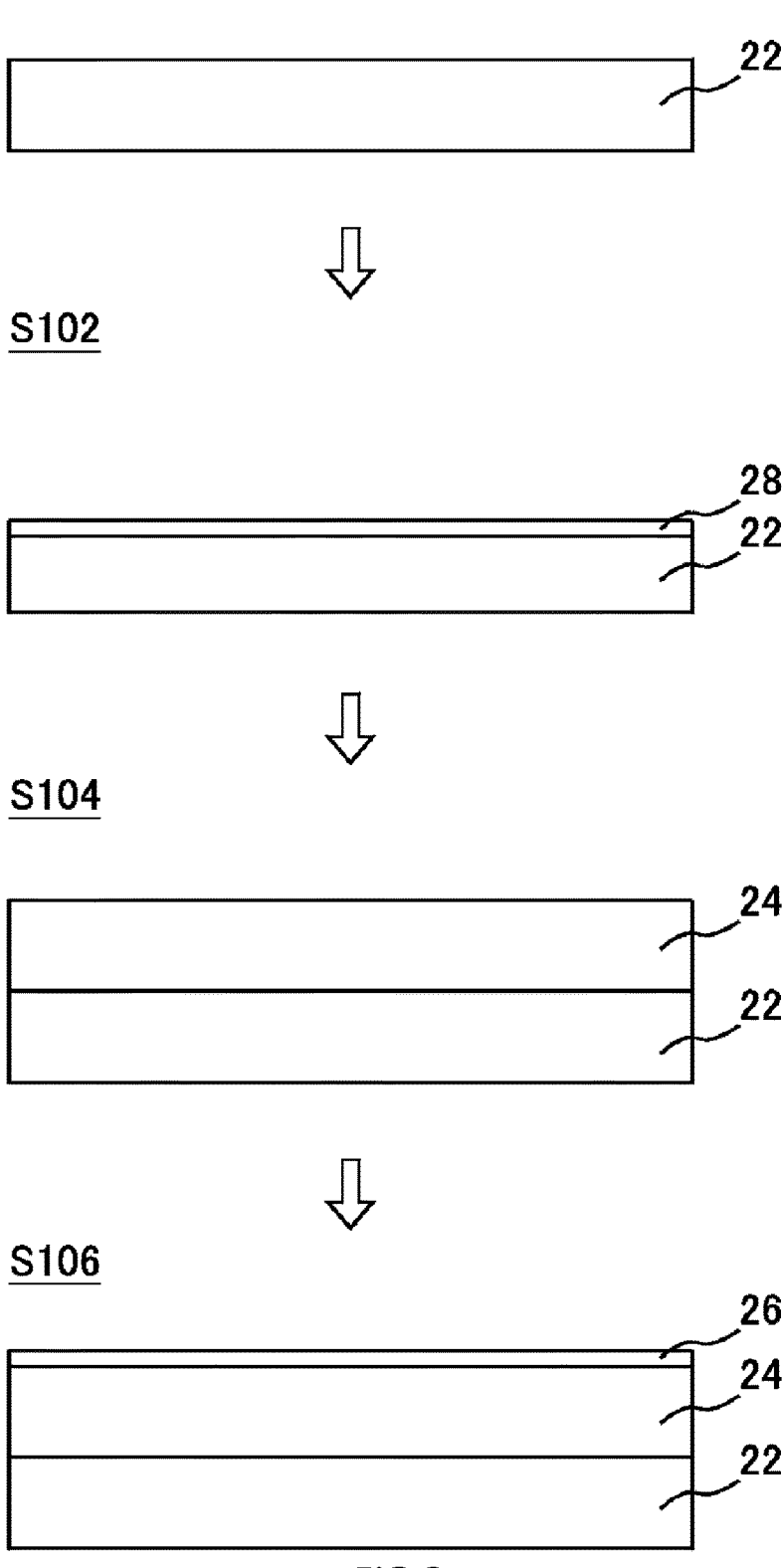
FIG. 2 illustrates an example of a manufacturing process of an electrode portion 20.

FIG. 2 illustrates an example of a manufacturing process of the electrode portion 20. The manufacturing process of the electrode portion 20 shown in the present example is an example and not limited thereto. In the present example, the illustration of the semiconductor substrate 10 provided below the first metal layer 22 is omitted.

A first metal layer 22 is provided above a semiconductor substrate 10 (S100). The method of providing the first metal layer 22 above the semiconductor substrate 10 is not limited in particular. The first metal layer 22 may be formed in a method such as sputtering or evaporation. A degreasing process, an etching process, and/or an acid pickling process may be performed on the semiconductor substrate 10 provided with the first metal layer 22. Another process for the preparation for forming plating may also be performed.

A zincate treatment is performed on the first metal layer 22 with a zincate solution (S102). The zincate solution may include sodium hydroxide, oxycarboxylic acid, sodium sulfate, zinc oxide, and iron. An alkaline solution in the zincate solution dissolves aluminum included in the surface of the first metal layer 22, which in turn may allow zinc and/or iron in the zincate solution to be deposited on the surface of the first metal layer 22. As a result, a zincate layer 28 including zinc and/or iron may be formed.

The flow rate of the zincate solution supplied to a bath for performing the zincate treatment may be 16 L/min or more and 20 L/min or less. Increasing the flow rate of the zincate solution can increase the amount of zinc ions and iron ions supplied to the surface of the first metal layer 22. This enables inhibiting only the etching of the first metal layer 22 from progressing in the absence of the supply of zinc ions and iron ions and inhibiting the surface of the first metal layer 22 from being rough.

The zinc concentration in the zincate solution may be 2.0 g/L or more and 3.0 g/L or less. The zinc concentration in the zincate solution being 2.0 g/L or more enables increasing the amount of zinc ions to be supplied to the surface of the first metal layer 22. This enables inhibiting only the etching of the first metal layer 22 from progressing in the absence of the supply of zinc ions and inhibiting the surface of the first metal layer 22 from being rough. If the zinc concentration in the zincate solution is set higher than 3.0 g/L, the amount of the alkaline solution in the zincate solution increases as the zinc concentration increases, which involves a risk of progression of the etch on the surface of the first metal layer 22 further than necessary. Therefore, the zinc concentration in the zincate solution may be 3.0 g/L or less.

When an undiluted solution of a zincate solution having an existing concentration ratio is diluted to be used, there is a problem that it is difficult to improve the zinc concentration in the zincate solution without increasing the amount of the alkaline solution in the zincate solution. As shown in the present example, increasing the flow rate of the zincate solution enables inhibiting the surface of the first metal layer 22 from being rough even when using an undiluted solution of a zincate solution having an existing concentration ratio.

A possible way to increase the amount of zinc ions supplied to the surface of the first metal layer 22 is extending immersing time in the zincate solution. However, if the flow rate of the zincate solution is low, etch on the surface of the first metal layer 22 further progresses at a portion where the amount of supplied zinc ions decreases instantaneously, resulting in the surface of the first metal layer 22 being rough. Thus, increasing the flow rate of the zincate solution without extending immersing time in the zincate solution is preferable. Increasing the flow rate of the zincate solution enables inhibiting the surface of the first metal layer 22 from being rough.

The iron concentration in the zincate solution may be 0.25 g/L or more and 0.35 g/L or less. The iron concentration in the zincate solution being 0.25 g/L or more enables improving the adhesiveness between the nickel-plated layer 24 and the first metal layer 22 to be formed later. Meanwhile, if the iron concentration in the zincate solution is excessively high, the deposition of zinc in the zincate process is hindered, which involves a risk of causing poor film formation of the nickel-plated layer 24 to be formed later. Therefore, the iron concentration in the zincate solution may be 0.35 g/L or less.

After the zincate treatment is performed on the first metal layer 22 provided above the semiconductor substrate 10 with the zincate solution (S102), a nickel-plated layer 24 is formed above the first metal layer 22 (S104). The nickel-plated layer 24 may be formed in a way that zinc and/or iron in the zincate layer 28 is/are dissolved, which in turn allows nickel in the nickel plating solution to be deposited on the surface of the first metal layer 22. The starting point of reaction for the nickel plating to be deposited may be zinc particles in the zincate layer 28. For thorough deposition of the nickel-plated layer, a thorough surface coating of the first metal layer 22 by zinc particles in the zincate layer 28 may be formed. Increasing the flow rate of the zincate solution in the zincate treatment (S102) enables the thorough surface coating of the first metal layer 22 by the zinc particles in the zincate layer 28 to be formed.

The flow rate of the nickel plating solution supplied to a bath for performing a nickel plating treatment on the semiconductor substrate 10 may be 16 L/min or more and 20 L/min or less. Increasing the flow rate of the nickel plating solution enables increasing the amount of nickel ions supplied to the surface of the zincate layer 28. This enables inhibiting only the etching of the first metal layer 22 from progressing in the absence of the supply of nickel ions and inhibiting the surface of the first metal layer 22 from being rough and enables the thorough nickel-plated layer 24 to be formed.

The nickel concentration in the nickel plating solution may be 4.5 g/L or more and 4.7 g/L or less. The nickel concentration in the nickel plating solution being 4.5 g/L or more enables increasing the amount of nickel ions supplied to the surface of the zincate layer 28. This enables inhibiting only the etching of the first metal layer 22 from progressing in the absence of the supply of nickel ions and inhibiting the surface of the first metal layer 22 from being rough and enables the thorough nickel-plated layer 24 to be formed.

The film formation rate of the nickel-plated layer 24 may be 0.1 μm/min or more and 0.2 μm/min or less. The film formation rate of the nickel-plated layer 24 may be a rate at which the film of the nickel-plated layer 24 is formed in the thickness direction. By way of example, if the film formation rate of the nickel-plated layer 24 is 0.1 μm/min, the thickness of the nickel-plated layer 24 from the lower surface to the upper surface when 1 minute elapsed from the start of forming the nickel-plated layer 24 is 0.1 μm. The film formation rate of the nickel-plated layer 24 being 0.1 μm/min or more and 0.2 μm/min or less may be a film formation rate when the nickel concentration in the nickel plating solution is 4.5 g/L or more and 4.7 g/L or less and/or when the flow rate of the nickel plating solution is 16 L/min or more and 20 L/min or less. In other words, the film formation rate of the nickel-plated layer 24 being 0.1 μm/min or more and 0.2 μm/min or less may be a film formation rate when a sufficient amount of nickel ions are supplied to the surface of the zincate layer 28.

Then, a gold-plated layer 26 is formed above the nickel-plated layer 24 (S106). The gold-plated layer 26 may be formed in a way that nickel in the surface of the nickel-plated layer 24 is dissolved, which in turn allows gold in the gold plating solution to be deposited on the surface of the nickel-plated layer 24. The film thickness of the gold-plated layer 26 may be 0.01 μm or more and 0.1 μm or less. The film thickness of the gold-plated layer 26 being 0.1 μm or less enables improving the bond between gold and a conductive member, such as a lead frame, and ensuring the reliability of the connection between the gold and the conductive member, such as a lead frame.

If the film thickness of the gold-plated layer 26 is thin, and the surface of the nickel-plated layer 24 has surface roughness, there is a risk that an overlapping point of a plurality of bumps due to the surface roughness is locally etched and a pinhole is caused. If a pinhole is formed in the gold-plated layer 26, there is a risk that, when dicing is performed on the semiconductor substrate 10, nickel ions is diffused from the pinhole portion and a nickel oxide layer is formed on the surface of the gold-plated layer 26.

In the present example, the flow rate of the zincate solution and the zinc concentration and/or iron concentration in the zincate solution are appropriately set in the zincate treatment (S102) so that the zincate layer is thoroughly formed. Also, the flow rate of the nickel plating solution and the nickel concentration in the nickel plating solution are appropriately set in the nickel plating forming (S104) so that the nickel-plated layer 24 is thoroughly formed. This enables inhibiting the surface roughness of the surface of the nickel-plated layer 24, and thus inhibiting a pinhole to be formed in the gold-plated layer 26 in the gold plating forming (S106).

The level of the surface roughness of the surface of the electrode portion 20 after forming the gold-plated layer 26 may be evaluated based on the wettability of solder when the solder is applied on the gold-plated layer 26. The wettability of the solder may be calculated using the following mathematical formula 1.

$$P=(1-h_a/h_b)\times 100 \qquad \text{(Mathematical Formula 1)}$$

Here, P is the wettability of solder, $h_a$ is the height of the solder after the solder spread, and $h_b$ is the height of the solder at the time of solder application. A height of solder may be a height of solder at the highest position among heights from the lower surface to the upper surface of the solder.

After applying solder, the solder spreads on the gold-plated layer 26, and as the height of the solder becomes lower relative to the height at the time of solder application, the wettability of the solder increases. By way of example, when the height of the solder at the time of solder application is 0.1 mm, and the height of the solder after the solder spread is 0.015 mm, the wettability of the solder is 85%. In the present example, the wettability of solder when applying the solder on gold-plated layer 26 may be 80% or more and 90% or less.

The solder may include tin, silver, copper, nickel, and germanium. By way of example, the content percentage of each element may be as follows: tin 95.2%; silver 3.5%; copper 0.5%; nickel 0.07%; and germanium 0.01%. When solder that does not include lead is used, the solder performs excellent environmental resistance, and it is close to a eutectic and excellent in thermal fatigue characteristics, strength, and wettability. The compositions of the solder used for evaluating the wettability and the solder used for connection with a bonding wire or bond with a lead frame may be the same.

Figure 3A:
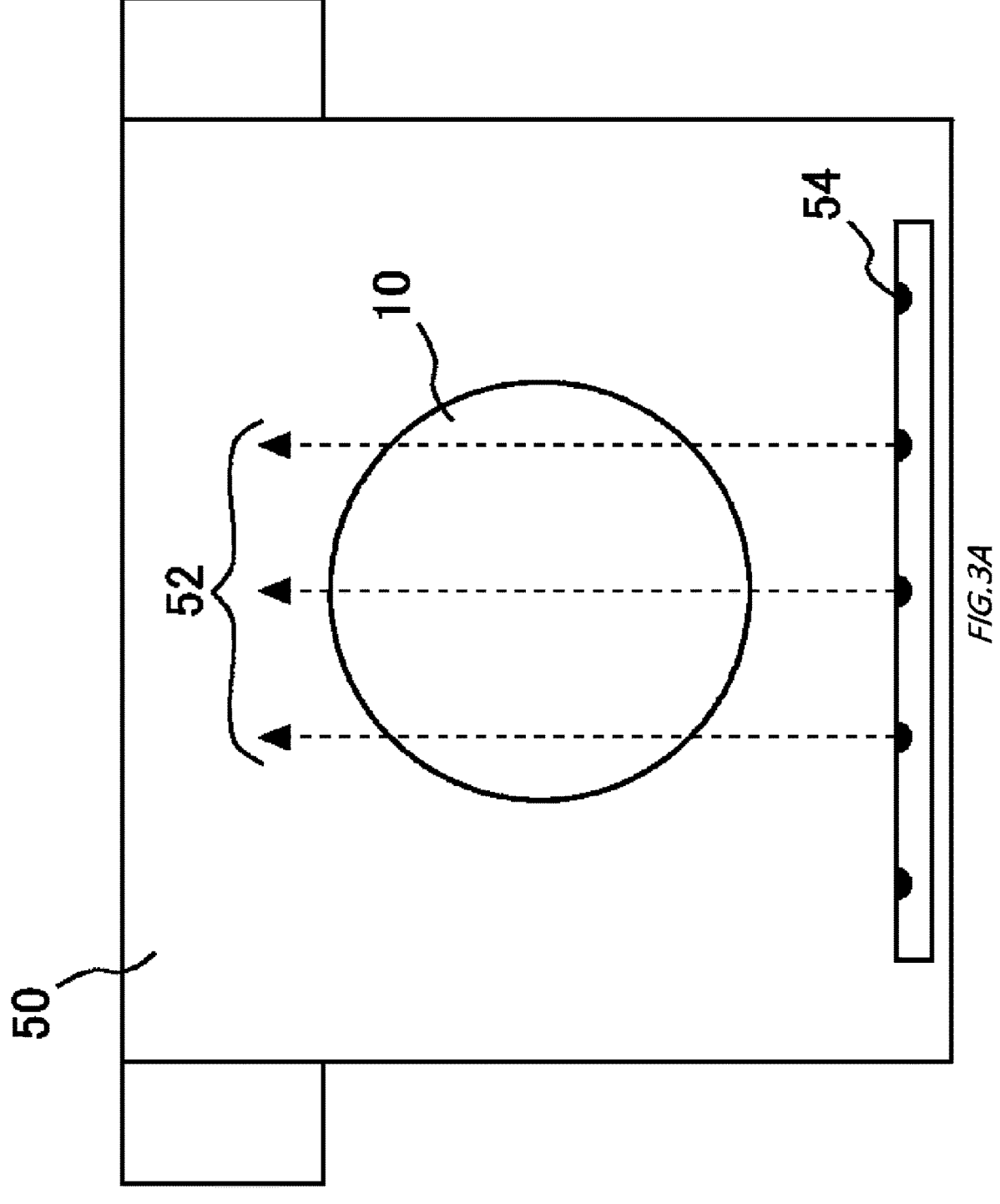
FIG. 3A illustrates an example of a cross-sectional view of a zincate process S102.

FIG. 3A illustrates an example of a cross-sectional view of the zincate process S102. In the zincate process S102, the semiconductor substrate 10 is placed in a bath 50 for performing a zincate treatment. The zincate solution 52 is ejected from ejection holes 54.

The semiconductor substrate 10 may be in wafer form. The number of the semiconductor substrates 10 provided in the bath 50 may be one, or may be more than one. A bath load representing the proportion of the volume of the bath 50 to the surface area of the semiconductor substrate 10 provided in the bath 50 may be 10 or more and 20 or less. In an example, a bath load may be 10.

In FIG. 3A, the illustration of the first metal layer 22 provided on the surface of the semiconductor substrate 10 is omitted. The first metal layer 22 provided on the surface of the semiconductor substrate 10 may be provided on a part of the semiconductor substrate 10, or may be divided and provided at a plurality of positions corresponding to chips on a wafer.

In FIG. 3A, dashed arrows indicate the flow of the zincate solution 52. In an example, the flow rate of the zincate solution 52 may be 18 L/min. Increasing the flow rate of the zincate solution can increase the amount of zinc ions and iron ions supplied to the surface of the first metal layer 22. This enables inhibiting only the etching of the first metal layer 22 from progressing in the absence of the supply of zinc ions and iron ions and inhibiting the surface of the first metal layer 22 from being rough.

Figure 3B:
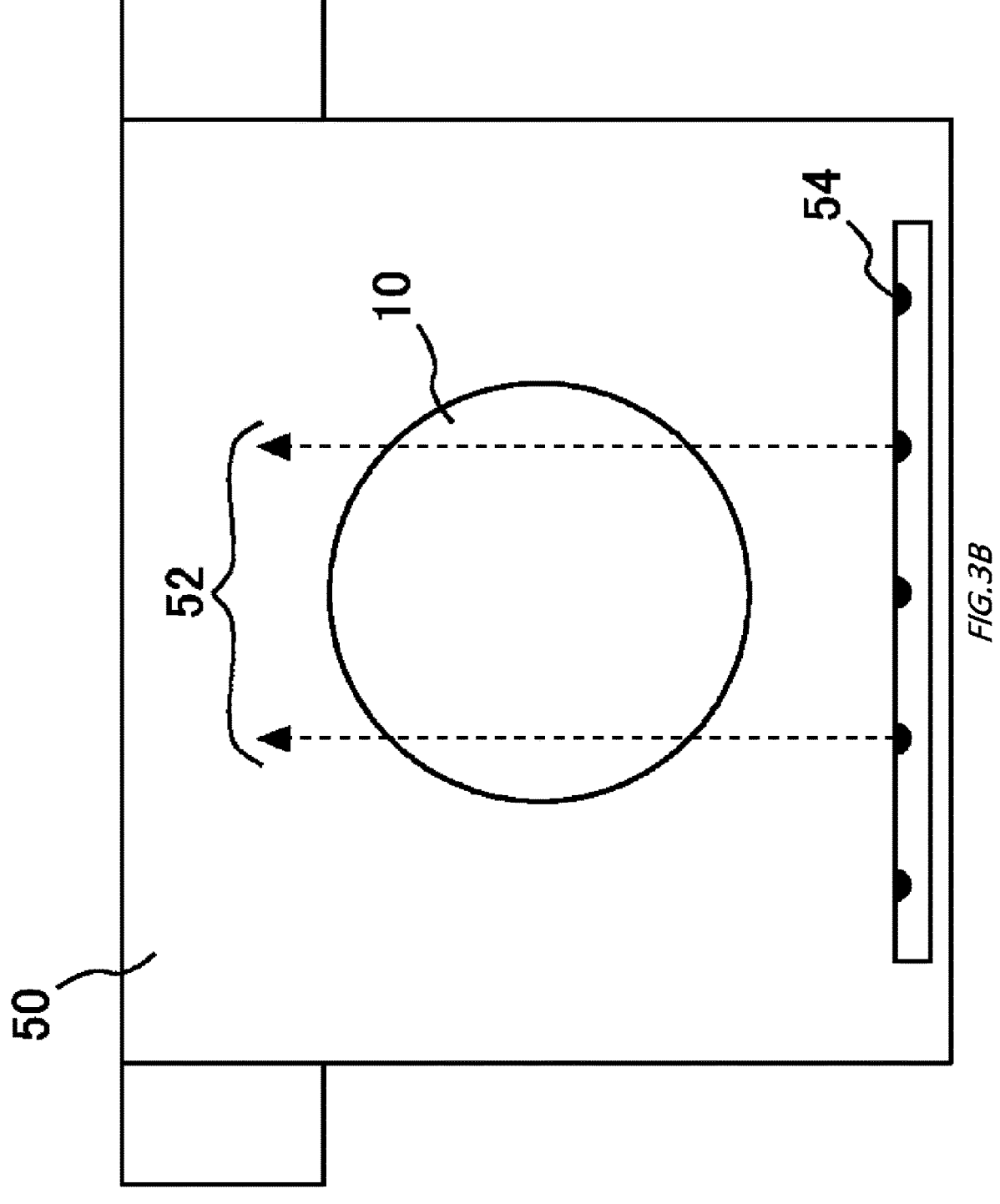
FIG. 3B illustrates an example of a cross-sectional view of a zincate process of a comparative example.

FIG. 3B illustrates an example of a cross-sectional view of the zincate process of a comparative example. The zincate process in the present example is different from that in the practical example of FIG. 3A in that the flow rate of the zincate solution 52 is lower. In an example, the flow rate of the zincate solution 52 may be 15 L/min. If the flow rate of the zincate solution 52 is low, there is a risk that zinc ions and iron ions are not sufficiently supplied to the surface of the first metal layer 22 and only the etching of the first metal layer 22 progresses. If only the etching of the first metal layer 22 progresses, and the zincate layer 28 is not sufficiently formed, there is a risk of causing the surface roughness of the nickel-plated layer 24. If the surface roughness of the nickel-plated layer 24 is caused, there is a risk of causing a pinhole in the gold-plated layer 26.

Figure 4:
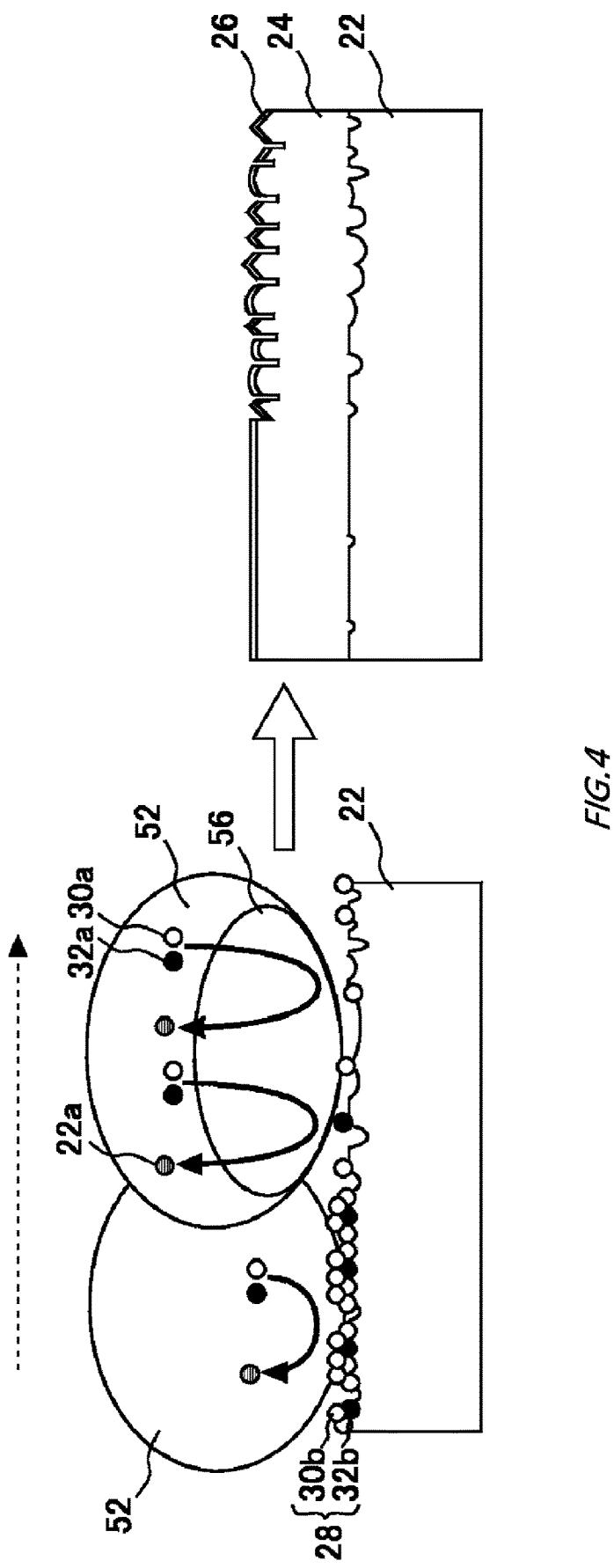
FIG. 4 illustrates an example of a schematic view of the zincate process to a gold plating process of the comparative example.

FIG. 4 illustrates an example of a schematic view of the zincate process to the gold plating process of the comparative example. In the zincate process, metal of the surface of the first metal layer 22 is dissolved into metal ions 22a, which in turn allows zinc ions 30a and iron ions 32a to be zinc 30b and iron 32b respectively and deposited on the surface of the first metal layer 22, so that a zincate layer 28 is formed. The dashed arrow in FIG. 4 indicates the flow of the zincate solution 52. A side of the start point of the arrow may be referred to as an upstream side, and a side of the end point of the arrow may be referred to as a downstream side.

Even if the flow rate of the zincate solution 52 is low, zinc ions 30a and iron ions 32a are sufficiently supplied to the surface of the first metal layer 22 on the upstream side of the zincate solution 52, so that metal ions 22a are dissolved, and correspondingly zinc 30b and iron 32b are deposited, and thus a zincate layer 28 is formed. Meanwhile, on the downstream side of the zincate solution 52, a pure water portion 56 not including zinc ions 30a and iron ions 32a is generated, so that zinc ions 30a and iron ions 32a are not sufficiently supplied to the surface of the first metal layer 22, and only the etching of the first metal layer 22, that is, the dissolution of metal ions 22a, progresses. Thus, there is a risk of causing the surface roughness on the surface of the first metal layer 22 and causing the surface roughness of the nickel-plated layer 24 to be formed later and a pinhole of the gold-plated layer 26. In the present example, ten pinholes are caused in the gold-plated layer 26.

Figure 5A:
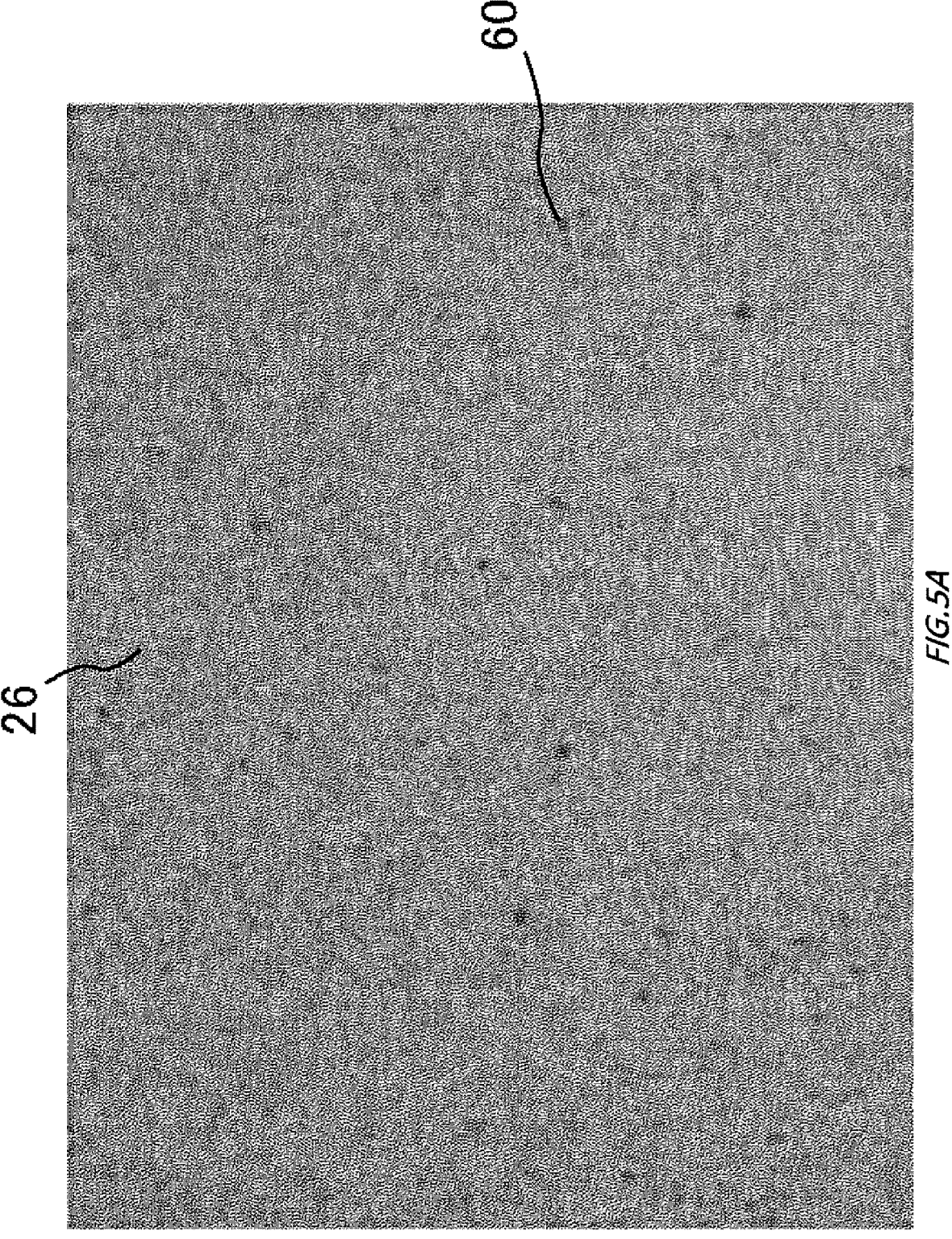
FIG. 5A illustrates an example of a surface picture of the electrode portion 20 after a gold plating process of the practical example.
Figure 5B:
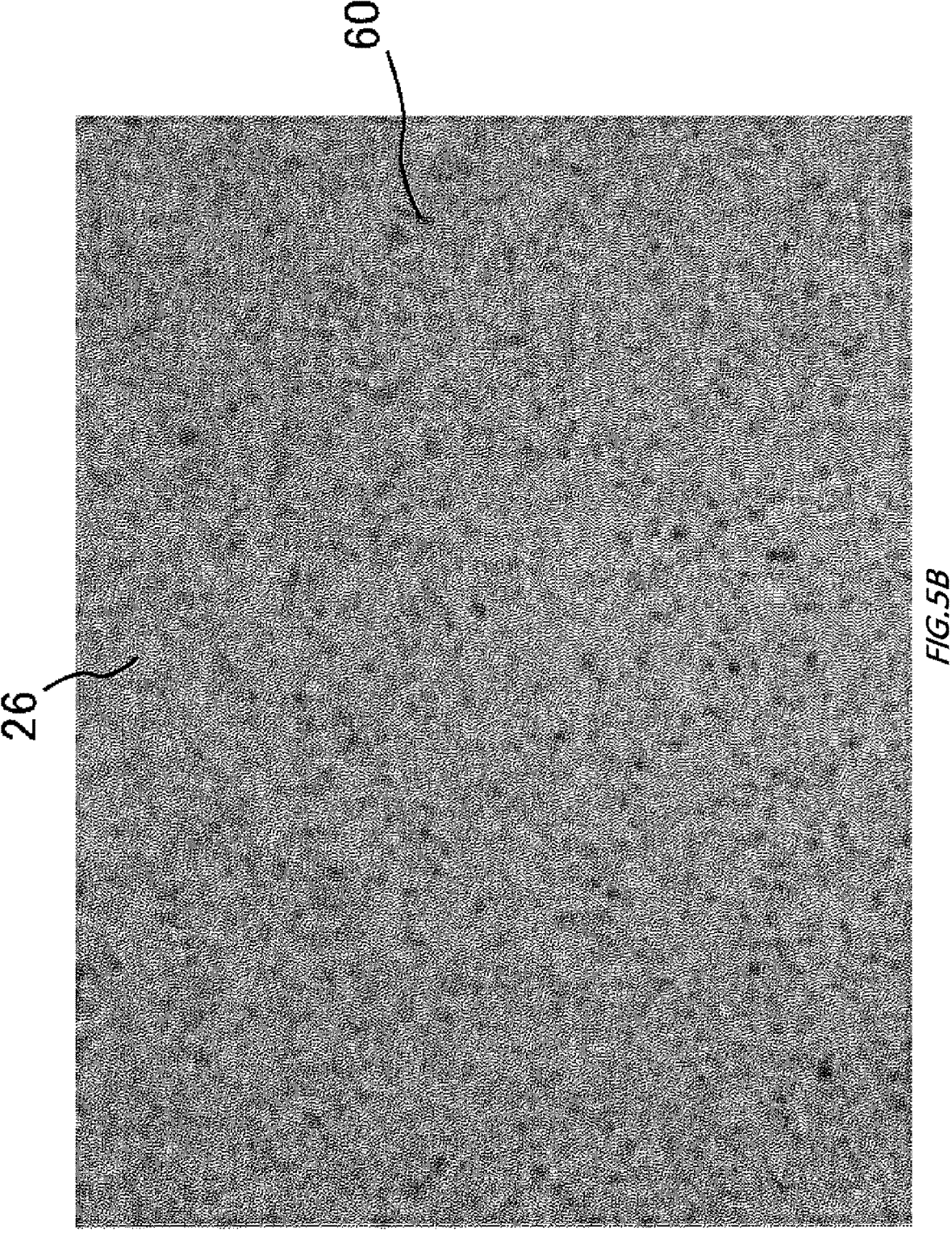
FIG. 5B illustrates an example of a surface picture of an electrode portion after the gold plating process of the comparative example.

FIG. 5A illustrates an example of a surface picture of the electrode portion 20 after the gold plating process of the practical example. A black spot 60 appearing on the surface of the gold-plated layer 26 in the figure shows surface roughness. In the practical example, the flow rate of the zincate solution, the zinc and iron concentrations in the zincate solution, the flow rate of the nickel plating solution, and the nickel concentration in the nickel plating solution are appropriately set so that surface roughness is inhibited, the number of spots 60 is reduced, and the density of the spots 60 is decreased.

FIG. 58 illustrates an example of a surface picture of the electrode portion after the gold plating process of the comparative example. In the comparative example, the flow rate of the zincate solution, the zinc and iron concentrations in the zincate solution, the flow rate of the nickel plating solution, and the nickel concentration in the nickel plating solution are not appropriately set, so that surface roughness is caused, the number of spots 60 is increased, and the density of the spots 60 is increased.

Figure 6:
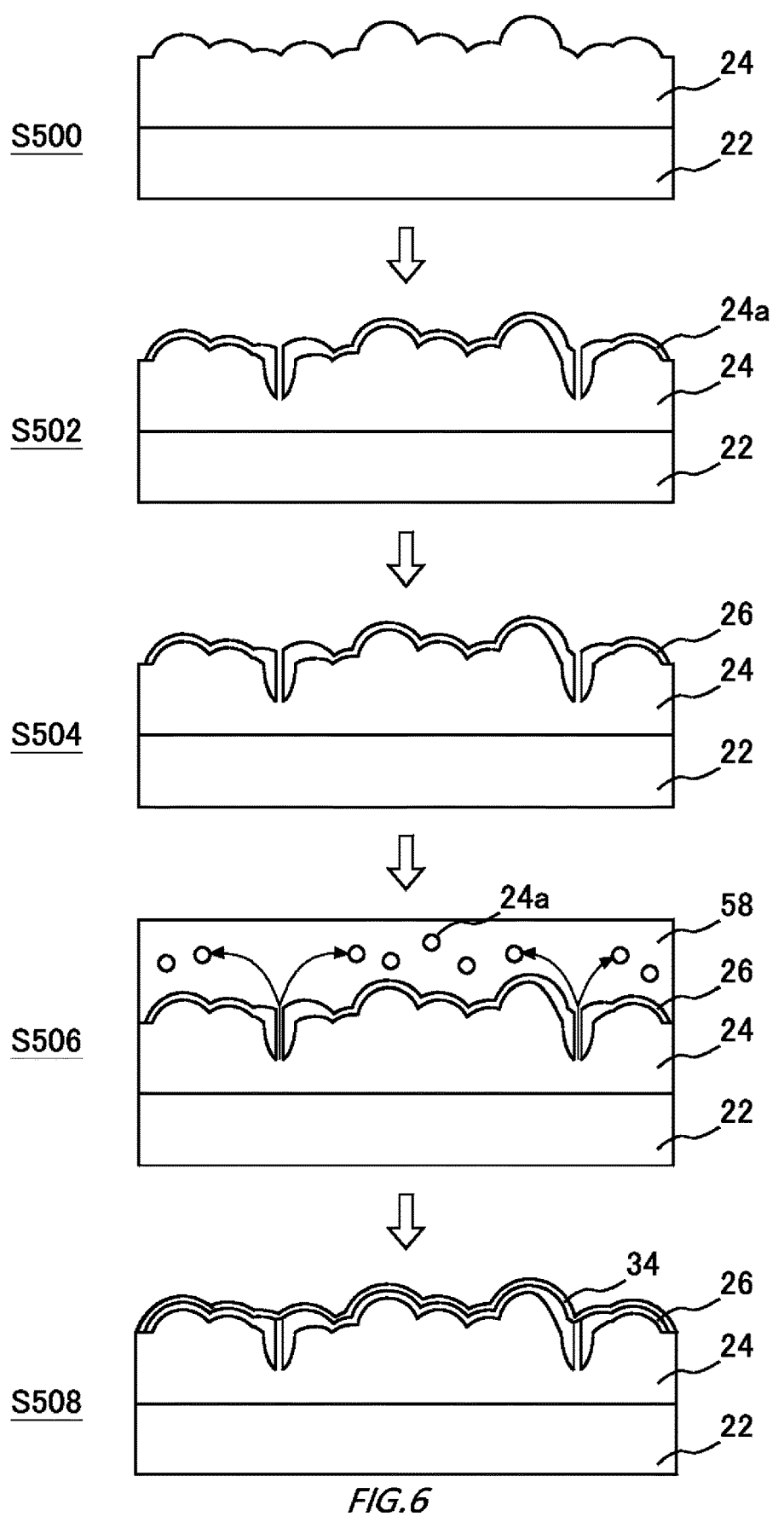

FIG. 6 illustrates an example of a cross-sectional view of the gold plating process and the dicing process of the comparative example.

At step S500, a nickel-plated layer 24 is provided above a first metal layer 22, and surface roughness is caused on the surface of the nickel-plated layer 24. At step S502, an alkaline solution in a gold plating solution causes the surface of the nickel-plated layer 24 to become nickel ions 24a and be dissolved. At this time, at an overlapping point of a plurality of bumps due to the surface roughness, local etching progresses, and then a pinhole is formed. In the present example, two pinholes are formed. At step S504, a gold-plated layer 26 is formed in the place of the dissolved nickel ions 24a. At step S506, the semiconductor substrate 10 is immersed in water 58 in the dicing process of the semiconductor substrate 10. At this time, nickel ions 24a are dissolved in the water 58 from a pinhole portion formed in the gold-plated layer 26. At step S508, the residues of the nickel ions 24a dissolved in the water 58 form a nickel oxide layer 34 on the surface of the gold-plated layer 26. The nickel oxide layer 34 formed in this manner along with the surface roughness of the surface of the electrode portion 20 may involve a risk of decreasing the wettability of the solder.

As a technique for preventing a nickel oxide layer 34 to be formed due to a pinhole, performing a sealing treatment as described in Patent document 1 is known. The sealing treatment has weak heat resistance and has a problem that the corrosion resistance is decreased by heating at the time of reflow soldering.

In the practical example, the flow rate of the zincate solution, the zinc and iron concentrations in the zincate solution, the flow rate of the nickel plating solution, and the nickel concentration in the nickel plating solution are appropriately set in the zincate process S102 and the nickel plating process S104 so that the surface roughness is inhibited, so that the formation of a pinhole in the gold plating process S106 is inhibited, and the formation of the nickel oxide layer 34 is inhibited. Thus, inhibiting the surface roughness and the formation of the nickel oxide layer 34 can improve the wettability of the solder of the electrode portion 20.

Figure 7A:
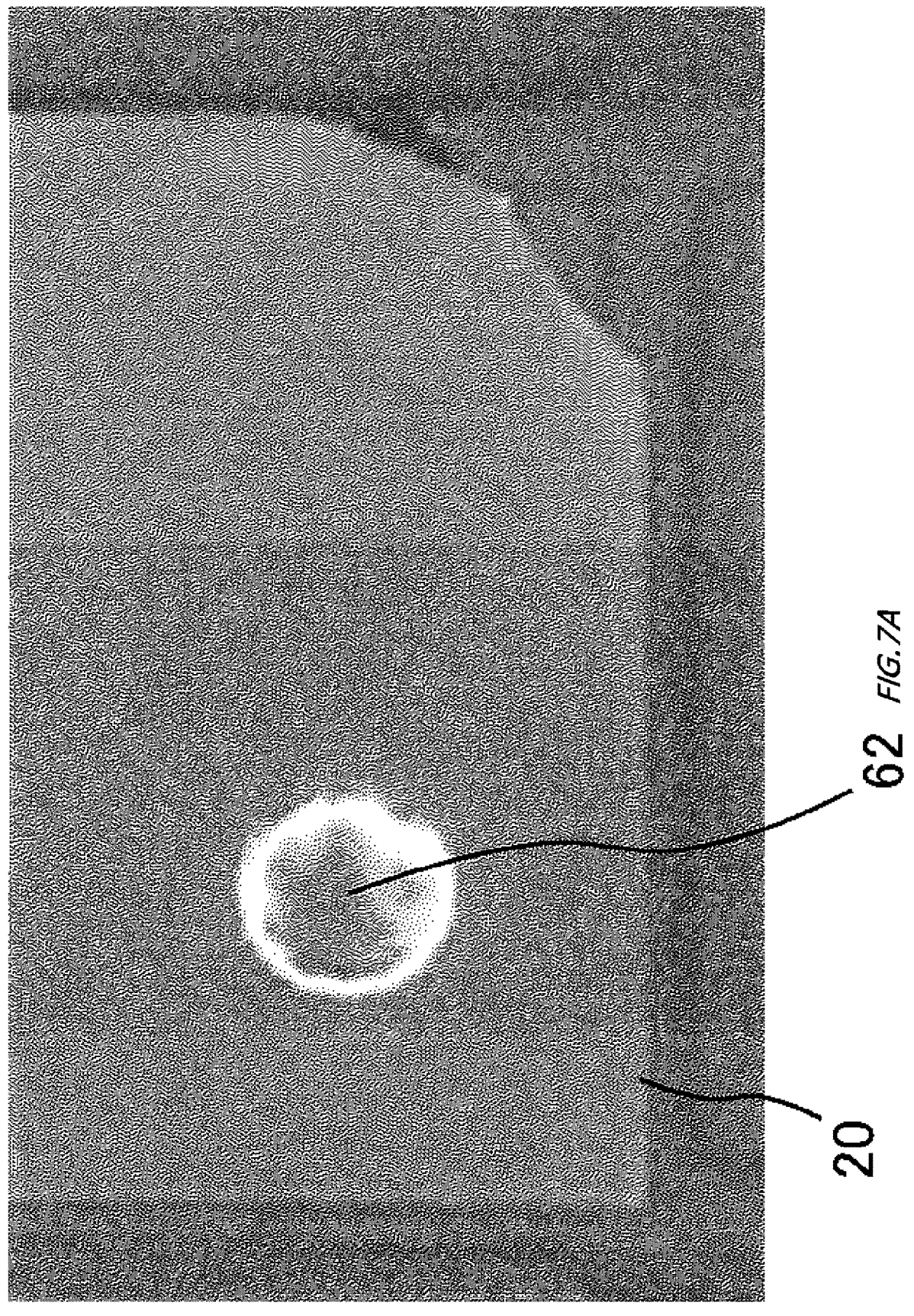
FIG. 7A illustrates an example of a surface picture when solder is dropped on the electrode portion 20 after the gold plating process of the practical example.
Figure 7B:
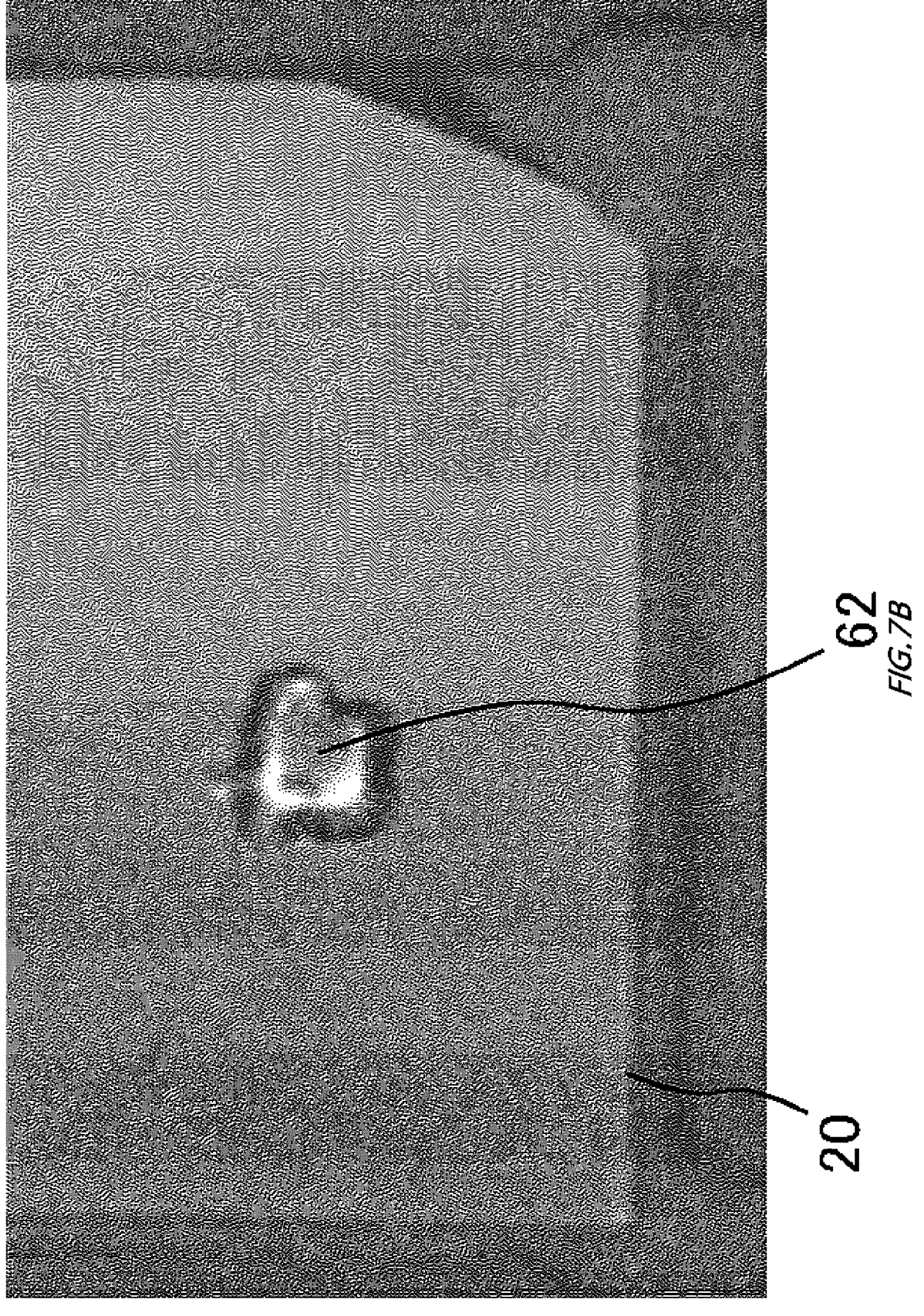
FIG. 7B illustrates an example of a surface picture when solder is dropped on the electrode portion after the gold plating process of the comparative example.

FIG. 7A illustrates an example of a surface picture when solder 62 is dropped on the electrode portion 20 after the gold plating process of the practical example. FIG. 7B illustrates an example of a surface picture when solder 62 is dropped on the electrode portion after the gold plating process of the comparative example. In the practical example, compared to the comparative example, the solder

62 dropped on the electrode portion 20 spreads in an isotropic manner in the in-plane direction, and the wettability of the solder was 85.6%. In the comparative example, the solder 62 spreads in a small extent, the way of spreading is in an anisotropic manner, and the wettability of the solder was 78.1%.

In the practical example, the flow rate of the zincate solution, the zinc and iron concentrations in the zincate solution, the flow rate of the nickel plating solution, and the nickel concentration in the nickel plating solution are appropriately set so that the wettability of the solder of the electrode portion 20 can be improved.

Figure 8:
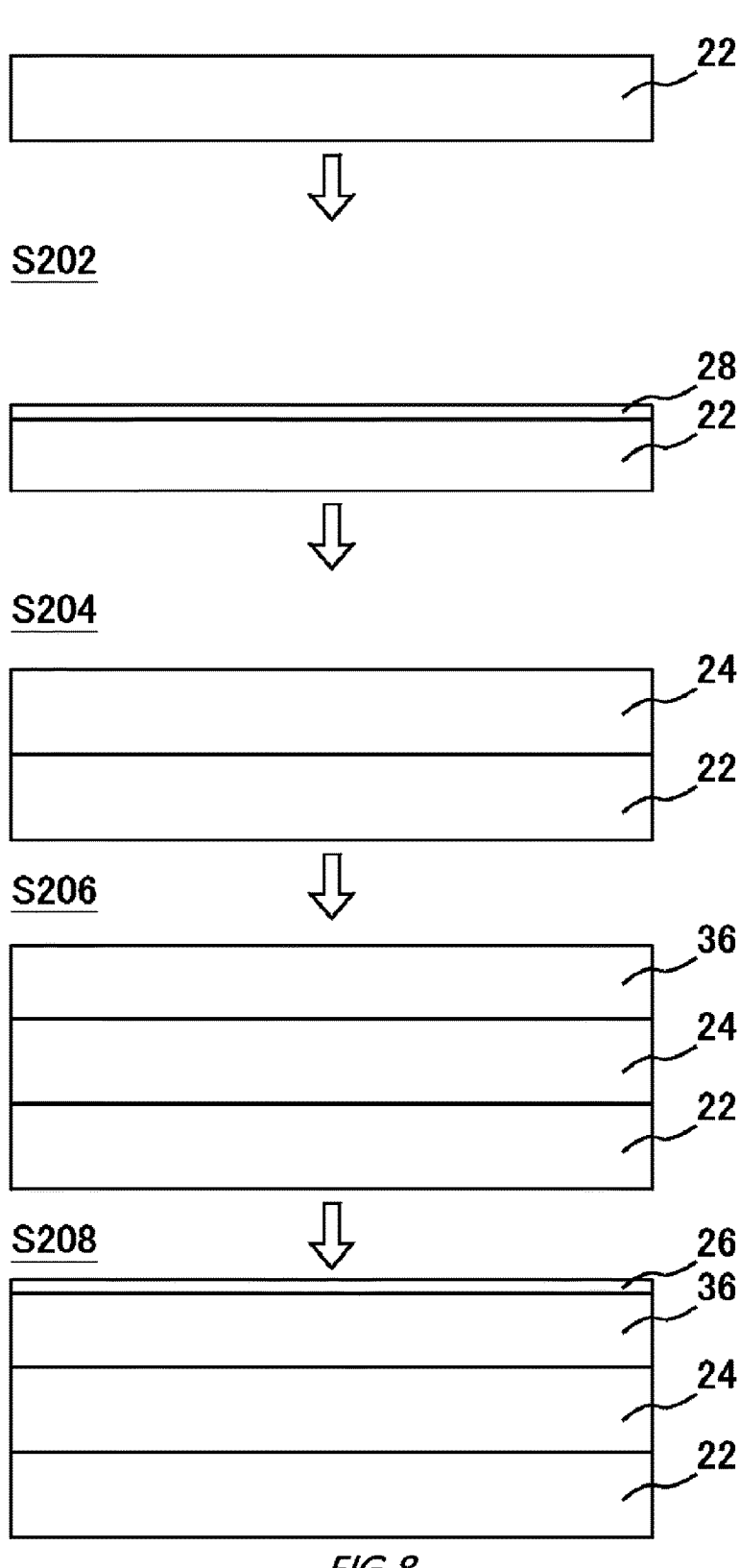
FIG. 8 shows a variation of the manufacturing process of the electrode portion 20.

FIG. 8 shows a variation of the manufacturing process of the electrode portion 20. In the variation, processes other than S206 are the same as S100 to S106, and thus the descriptions for them are omitted.

The variation may comprise a step of forming a palladium-plated layer 36 above the nickel-plated layer 24 after the forming the nickel-plated layer 24 above the first metal layer 22 (S204, S104) and before the forming the gold-plated layer 26 above the nickel-plated layer 24 (S208, S106). Providing the palladium-plated layer 36 between the nickel-plated layer 24 and the gold-plated layer 26 enables inhibiting the nickel ion 24a from being diffused from a nickel-plated layer 24 through a pinhole and inhibiting the nickel oxide layer 34 from being formed even if a pinhole is formed in the gold-plated layer 26.

While the present invention has been described by way of the embodiments, the technical scope of the present invention is not limited to the above described embodiments. It is apparent to persons skilled in the art that various alterations or improvements can be made to the above described embodiments. It is also apparent from the description of the claims that the embodiments to which such alterations or improvements are made can be included in the technical scope of the present invention.

The operations, procedures, steps, and stages of each process performed by an apparatus, system, program, and method shown in the claims, specification, or drawings can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

EXPLANATION OF REFERENCES

10: semiconductor substrate, 20: electrode portion, 22: first metal layer, 24: nickel-plated layer, 26: gold-plated layer, 28: zincate layer, 30: zinc, 32: iron, 34: nickel oxide layer, 36: palladium-plated layer, 50: bath, 52: zincate solution, 54: ejection hole, 56: pure water portion, 58: water, 60: spot, 62: solder, 100: semiconductor device.

What is claimed is:
1. A manufacturing method of a semiconductor device, comprising:
performing a zincate treatment on a first metal layer provided above a semiconductor substrate with a zincate solution;
forming a nickel-plated layer above the first metal layer; and
forming a gold-plated layer above the nickel-plated layer, wherein in the performing the zincate treatment, a flow rate of the zincate solution supplied to a bath for performing the zincate treatment is 16 L/min or more and 20 L/min or less.

2. The manufacturing method of the semiconductor device according to claim 1, wherein the zincate solution includes all of sodium hydroxide, oxycarboxylic acid, sodium sulfate, zinc oxide, and iron.

3. The manufacturing method of the semiconductor device according to claim 2, wherein a zinc concentration in the zincate solution is 2.0 g/L or more and 3.0 g/L or less.

4. The manufacturing method of the semiconductor device according to claim 3, wherein an iron concentration in the zincate solution is 0.25 g/L or more and 0.35 g/L or less.

5. The manufacturing method of the semiconductor device according to claim 1, wherein a wettability of solder when the solder is applied on the gold-plated layer is 80% or more and 90% or less.

6. The manufacturing method of the semiconductor device according to claim 5, wherein the solder includes all of tin, silver, copper, nickel, and germanium.

7. The manufacturing method of the semiconductor device according to claim 1, wherein in the forming the nickel-plated layer, a flow rate of a nickel plating solution supplied to a bath for performing a nickel plating treatment on the semiconductor substrate is 16 L/min or more and 20 L/min or less.

8. The manufacturing method of the semiconductor device according to claim 7, wherein the zincate solution includes all of sodium hydroxide, oxycarboxylic acid, sodium sulfate, zinc oxide, and iron.

9. The manufacturing method of the semiconductor device according to claim 8, wherein a zinc concentration in the zincate solution is 2.0 g/L or more and 3.0 g/L or less.

10. The manufacturing method of the semiconductor device according to claim 9, wherein an iron concentration in the zincate solution is 0.25 g/L or more and 0.35 g/L or less.

11. The manufacturing method of the semiconductor device according to claim 7, wherein a wettability of solder when the solder is applied on the gold-plated layer is 80% or more and 90% or less.

12. The manufacturing method of the semiconductor device according to claim 7, wherein a nickel concentration in the nickel plating solution is 4.5 g/L or more and 4.7 g/L or less.

13. The manufacturing method of the semiconductor device according to claim 12, wherein the zincate solution includes all of sodium hydroxide, oxycarboxylic acid, sodium sulfate, zinc oxide, and iron.

14. The manufacturing method of the semiconductor device according to claim 13, wherein a zinc concentration in the zincate solution is 2.0 g/L or more and 3.0 g/L or less.

15. The manufacturing method of the semiconductor device according to claim 14, wherein an iron concentration in the zincate solution is 0.25 g/L or more and 0.35 g/L or less.

16. The manufacturing method of the semiconductor device according to claim 12, wherein a wettability of solder when the solder is applied on the gold-plated layer is 80% or more and 90% or less.

17. The manufacturing method of the semiconductor device according to claim 1, wherein a film formation rate of the nickel-plated layer is 0.1 μm/min or more and 0.2 μm/min or less.

18. The manufacturing method of the semiconductor device according to claim 1, wherein a film thickness of the gold-plated layer is 0.01 μm or more and 0.1 μm or less.

19. The manufacturing method of the semiconductor device according to claim 1, wherein the first metal layer includes at least either aluminum or an aluminum-silicon alloy.

20. The manufacturing method of the semiconductor device according to claim 1, comprising forming a palladium-plated layer above the nickel-plated layer after the forming the nickel-plated layer above the first metal layer and before the forming the gold-plated layer above the nickel-plated layer.

* * * * *